US012628311B2

(12) United States Patent
Huang

(10) Patent No.: US 12,628,311 B2
(45) Date of Patent: May 12, 2026

(54) IMMERSED LIQUID COOLING DEVICE

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 238 days.

(21) Appl. No.: 18/618,963

(22) Filed: Mar. 27, 2024

(65) Prior Publication Data

US 2025/0294701 A1     Sep. 18, 2025

(30) Foreign Application Priority Data

Mar. 12, 2024    (TW) ................................. 113109029

(51) Int. Cl.
H05K 7/20          (2006.01)

(52) U.S. Cl.
CPC ..... H05K 7/20236 (2013.01); H05K 7/20263 (2013.01); H05K 7/20272 (2013.01); H05K 7/20418 (2013.01)

(58) Field of Classification Search
CPC .......... H05K 7/20272; H05K 7/20263; H05K 7/20254; H05K 7/20772; H05K 7/20781; H05K 7/20236; H05K 7/20218; H05K 7/20281; H05K 7/20836; H05K 7/20418; H05K 7/20172; H05K 7/203; H05K 7/20327; H05K 7/2039; H05K 7/20436; H05K 7/20509; H05K 7/20727; H05K 7/20763; F28F 2250/08; F28F 9/0202; F28F 9/0224; F28F 3/12; F28F 9/02; F28F 9/0217; F28F 9/0212; F28F 9/0221; F28F 9/0246; F28F 9/0248; G06F 1/20; G06F 2200/201; G06F 1/206; G06F 1/181; F28D 2021/0031; F28D 2021/0029; H10W 40/28; H10W 40/47
See application file for complete search history.

(56) References Cited

U.S. PATENT DOCUMENTS

| | | | |
|---|---|---|---|
| 2004/0008483 A1* | 1/2004 | Cheon ....................... | G06F 1/20 361/699 |
| 2005/0068728 A1* | 3/2005 | Chu .................... | H05K 7/20772 361/679.48 |
| 2008/0121384 A1* | 5/2008 | Tseng .................... | F28F 9/0226 165/149 |
| 2018/0195804 A1* | 7/2018 | Mai .......................... | F28D 1/024 |
| 2021/0018229 A1* | 1/2021 | Lan ........................ | H01L 23/427 |
| 2021/0180890 A1* | 6/2021 | Cheng ....................... | F28D 1/04 |

(Continued)

*Primary Examiner* — Michael A Matey
(74) *Attorney, Agent, or Firm* — Che-Yang Chen; Law Office of Michael Chen

(57)          ABSTRACT

The invention discloses an immersed liquid cooling device, which includes a liquid cooling radiator with a first liquid box at one end thereof combined with the open end of a liquid storage box, so that a heat dissipation radiator pipe set at the other end is immersed in the cooling fluid in the liquid storage box. The liquid storage box is externally equipped with a cooling chip and a heat sink. When the cooling chip is energized, the cooling chip will reduce the cooling fluid in the liquid storage box to a freezing temperature, so that the cooling fluid can quickly cool down the working fluid in the heat dissipation radiator pipe set, thereby preventing the heat dissipation radiator pipe set from being affected by the ambient temperature in its heat dissipation efficiency.

13 Claims, 11 Drawing Sheets

(56)                    References Cited

U.S. PATENT DOCUMENTS

| | | | | |
|---|---|---|---|---|
| 2022/0178627 A1* | 6/2022 | Huang | ................. | F28F 9/0209 |
| 2022/0252354 A1* | 8/2022 | Huang | .................... | F28D 7/16 |
| 2022/0381516 A1* | 12/2022 | Huang | .................. | F28D 1/024 |
| 2023/0194177 A1* | 6/2023 | Huang | ................. | F28F 9/0209 |
| | | | | 165/67 |
| 2024/0318926 A1* | 9/2024 | Huang | .............. | F28D 1/05391 |
| 2024/0334645 A1* | 10/2024 | Huang | ................... | F25D 19/00 |
| 2025/0035346 A1* | 1/2025 | Nagimov | .......... | H05K 7/20263 |

* cited by examiner

IMMERSED LIQUID COOLING DEVICE

BACKGROUND OF THE INVENTION

1. Field of the Invention

The present invention relates to a liquid cooling device used in the field of processor heat dissipation technology, and in particular, to an immersed liquid cooling device that improves the heat dissipation efficiency of the liquid cooling device for the processor through the cooling effect of thermoelectric materials.

2. Description of the Related Art

Heat dissipating devices, such as those shown in US20060185378A1 and US20130299139A1, usually have a liquid cooling head for fitting on the surface of the processor, a liquid cooling radiator for heat dissipation, and two liquid pipes connected between the liquid cooling head and the liquid cooling radiator, and a liquid pump drives the working fluid to circulate between the liquid cooling head and the liquid cooling radiator. When the working fluid passes through the liquid cooling head, it takes away the heat of the processor, and then flows into the liquid cooling radiator for heat dissipation, so that the working fluid cools down and then flows to the liquid cooling head. According to this circular flow, heat is dissipated.

The structure of a liquid cooling radiator is shown in U.S. Pat. No. 11,774,192 B2, which has a liquid inlet box, a liquid collecting box, a plurality of exhaust pipes and a fan. The liquid inlet box is divided into a hot liquid chamber and a cold liquid chamber by a partition. The wall of the liquid inlet box is provided with a hot liquid inlet and a cold liquid outlet that connect the hot liquid chamber and the cold liquid chamber. The hot liquid inlet and the cold liquid outlet are respectively connected to the liquid cooling head through the above-mentioned liquid pipes. The exhaust pipes are connected between the liquid inlet box and the liquid collection box, and the fans are set outside the exhaust pipes. Therefore, when the high-temperature working fluid enters the liquid inlet box from the hot liquid inlet and flows to the liquid collecting box, and then flows back from the liquid collecting box to the liquid inlet box and cold liquid outlet, and fans are used to supply air to the exhaust pipes for air cooling and heat dissipation, causing the working fluid to cool down.

However, the conventional liquid cooling radiator technology that uses fans to dissipate heat from the working fluid is easily affected by the ambient temperature. For example, when the room temperature is too high, the air cooling efficiency of the liquid cooling radiator will decrease, which directly affects the heat dissipation efficiency of the liquid cooling device for the processor.

SUMMARY OF THE INVENTION

The main object of the present invention is to provide an immersed liquid cooling device. The first liquid box at one end of a liquid cooling radiator is welded and assembled to the open end of a liquid storage box, so that the second liquid box at the other end of the liquid cooling radiator and the heat dissipation radiator pipe set are immersed in the cooling fluid inside the liquid storage box. There is a cooling chip on the outside of the liquid storage box, which cools the cooling fluid in the liquid storage box to a freezing temperature, so that the cooling fluid can quickly cool down the working fluid circulating in the heat dissipation radiator pipe set. This allows the liquid cooling radiator to dissipate heat without being affected by the ambient temperature, thereby improving the heat dissipation efficiency of the liquid cooling device for the processor.

Another object of the present invention is to provide an immersed liquid cooling device, which allows the liquid cooling radiator to be stably installed into the liquid storage box through the positioning rails in the liquid storage box and the positioning frame structures on both sides of the liquid cooling radiator.

Still another object of the present invention is to provide an immersed liquid cooling device, which improves the internal heat resistance structure of the liquid box at one end of the liquid cooling radiator so that the hot liquid flowing through the hot liquid chamber will not conduct heat to the cold liquid chamber and the cooling liquid will not be heated by the hot liquid in the hot liquid chamber.

DETAILED DESCRIPTION OF THE INVENTION

Figure 1:
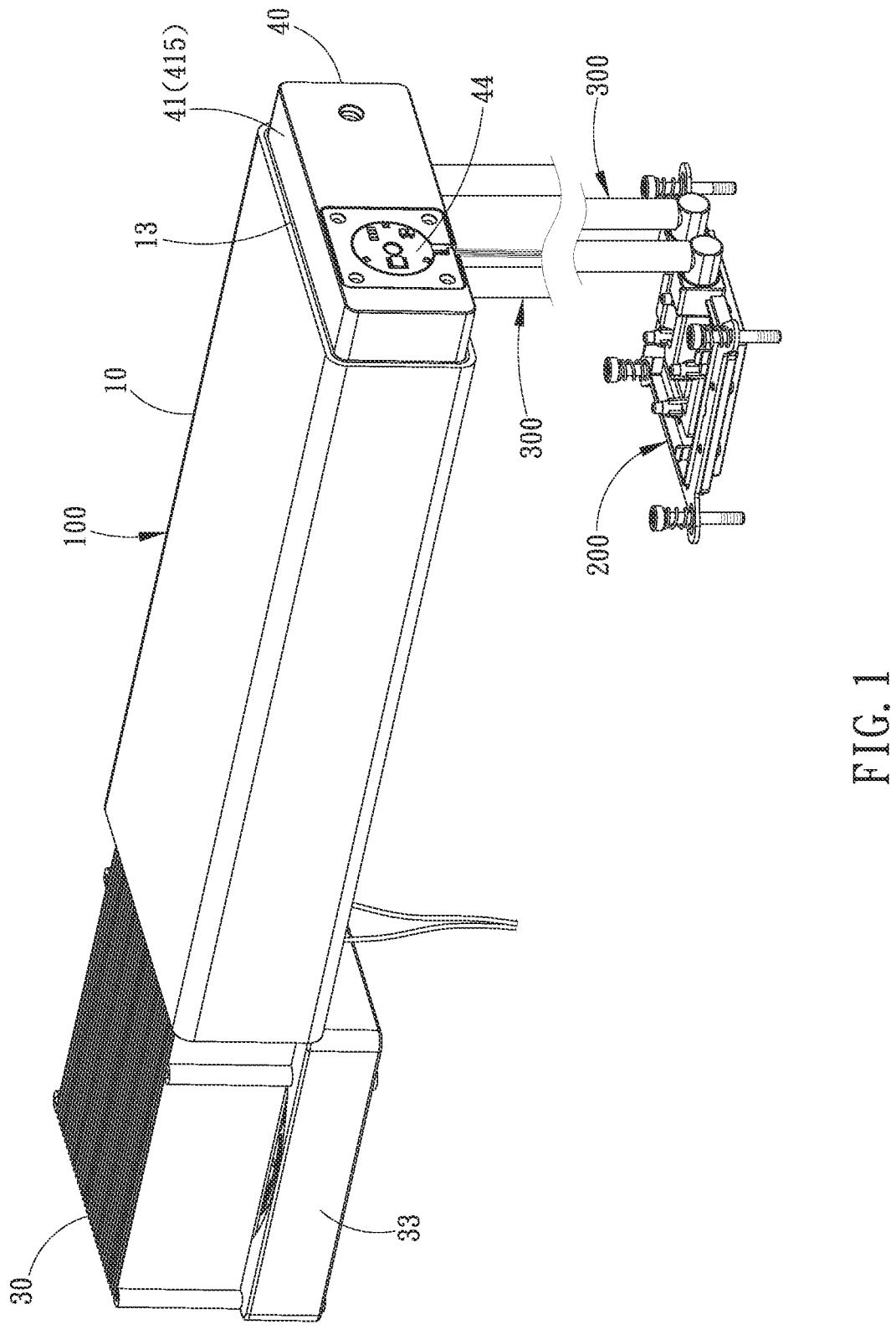
FIG. 1 is a schematic three-dimensional view of the first embodiment of the immersed liquid cooling device of the present invention.
Figure 2:
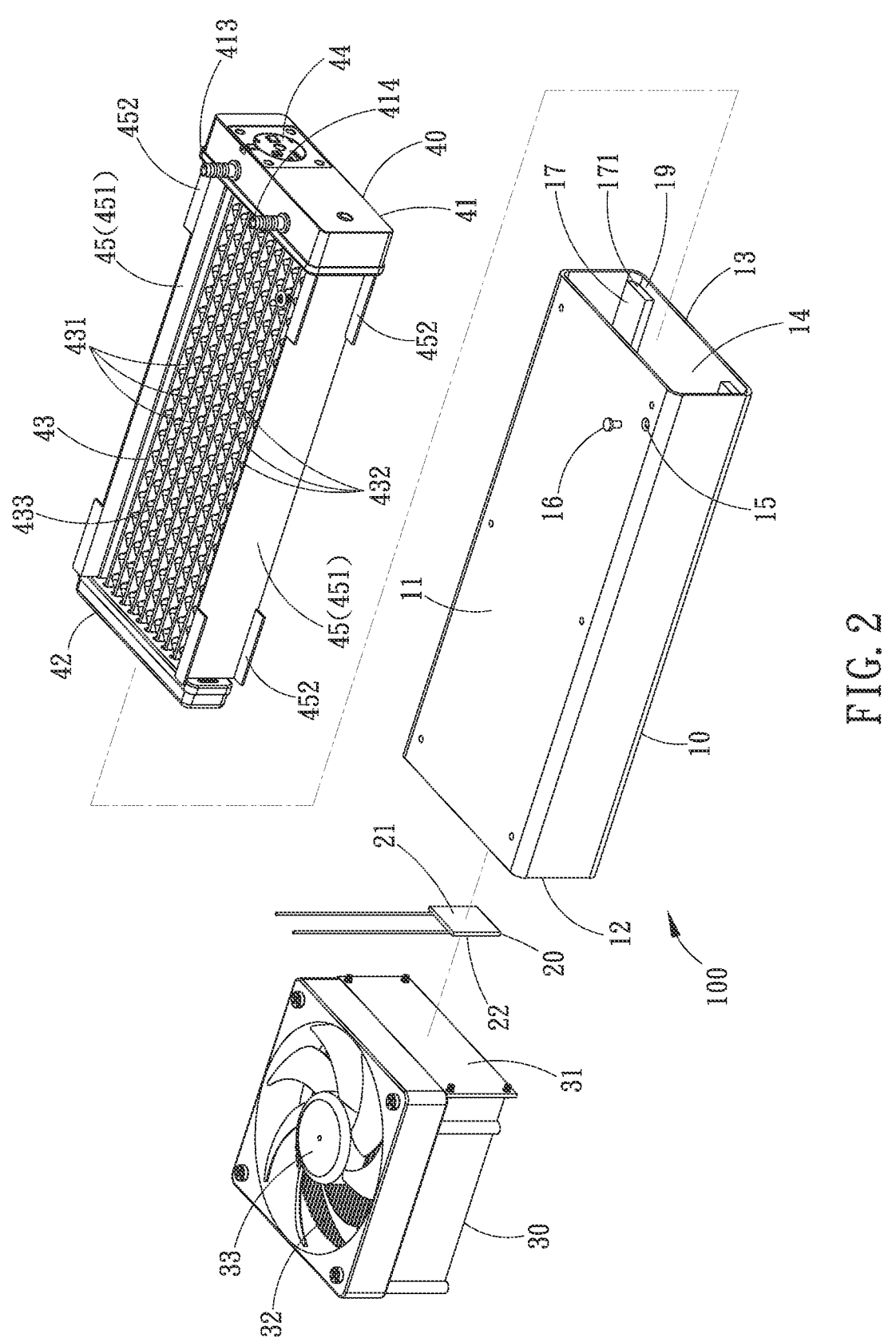
FIG. 2 is a front exploded schematic diagram of the first embodiment of the immersed liquid cooling device of the present invention.
Figure 3:
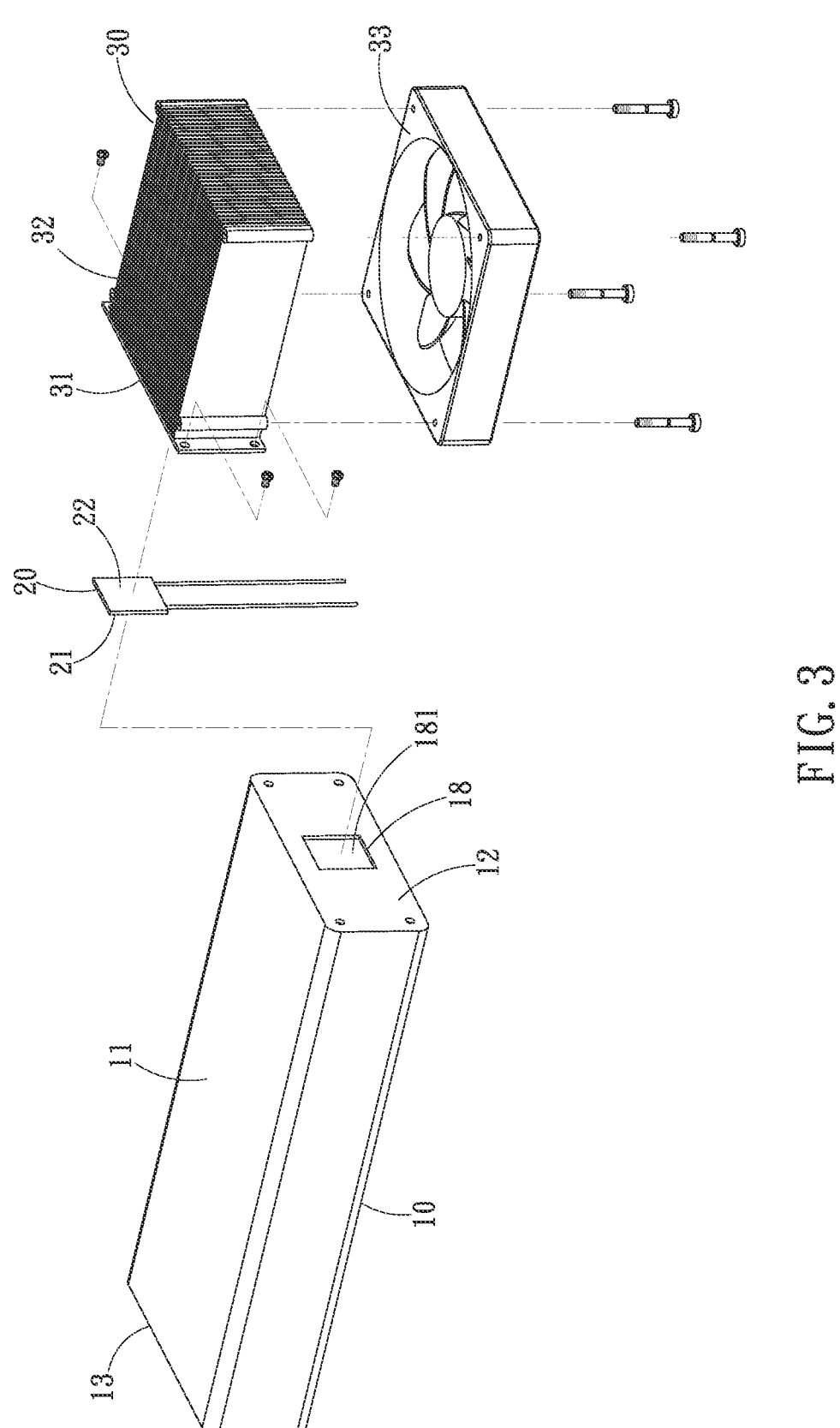
FIG. 3 is an exploded schematic diagram of the first embodiment of the immersed liquid cooling device according to the present invention.

Referring to FIG. 1, an immersed liquid cooling device 100 of the present invention is used to combine with a liquid cooling head 200 and two liquid pipes 300 to form a liquid cooling device used in computers and servers to dissipate heat from the working fluid flowing through the liquid cooling head 200. Referring to FIG. 2 and FIG. 3 together, a preferred embodiment of the immersed liquid cooling device 100 of the present invention comprises: a liquid storage box 10, a cooling chip 20, a heat sink 30 and a liquid cooling radiator 40.

Figure 4:
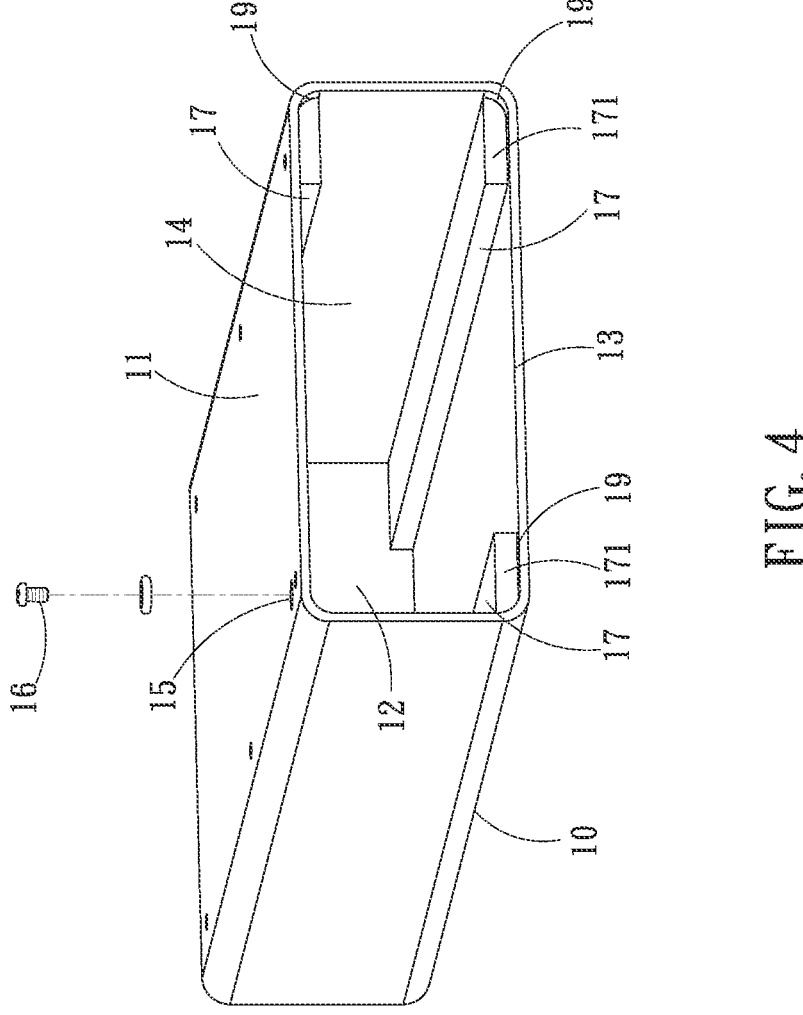
FIG. 4 is a schematic three-dimensional view of the front end of the liquid storage box in FIG. 2 of the present invention.

The liquid storage box 10 is a one-piece stamped metal box, preferably made of aluminum alloy with better thermal conductivity. Its structure comprises a peripheral wall 11, a rear wall 12, a front opening 13 and a liquid storage chamber 14 (as shown in FIG. 2 to FIG. 4). The peripheral wall 11 is provided with a liquid injection hole 15 connected to the liquid storage chamber 14 at a selected location, and a bolt 16 locked in the liquid injection hole 15 for injecting a cooling fluid into the liquid storage chamber 14.

The cooling chip 20 is a cooling chip made of semiconductor material that can convert thermal energy and electrical energy to each other. It is attached to the outside the rear wall 12 of the liquid storage box 10. The rear wall 12 of the liquid storage box 10 may be provided with a groove 18, and the cooling chip 20 may be embedded in the groove 18 so that its cold surface 21 is in contact with the groove base 181 of the groove 18.

The heat sink 30 is made of aluminum alloy with better thermal conductivity, comprising a base 31 and a plurality of radiating fins 32. The heat sink 30 is locked to the rear wall 12 of the liquid storage box 10 through screws, so that its base 31 is attached to a hot surface 22 of the cooling chip 20 for cooling the hot surface 22 of the cooling chip 20, thereby achieving the effect of maintaining the cold surface 21 of the cooling chip 20 at a low temperature. The heat sink 30 can be equipped with a fan 33 according to actual needs. The fan 33 is arranged on any side of the heat sink 30 to drive the cold air to pass through the radiating fins 32 of the heat sink 30 for heat dissipation.

Figure 5:
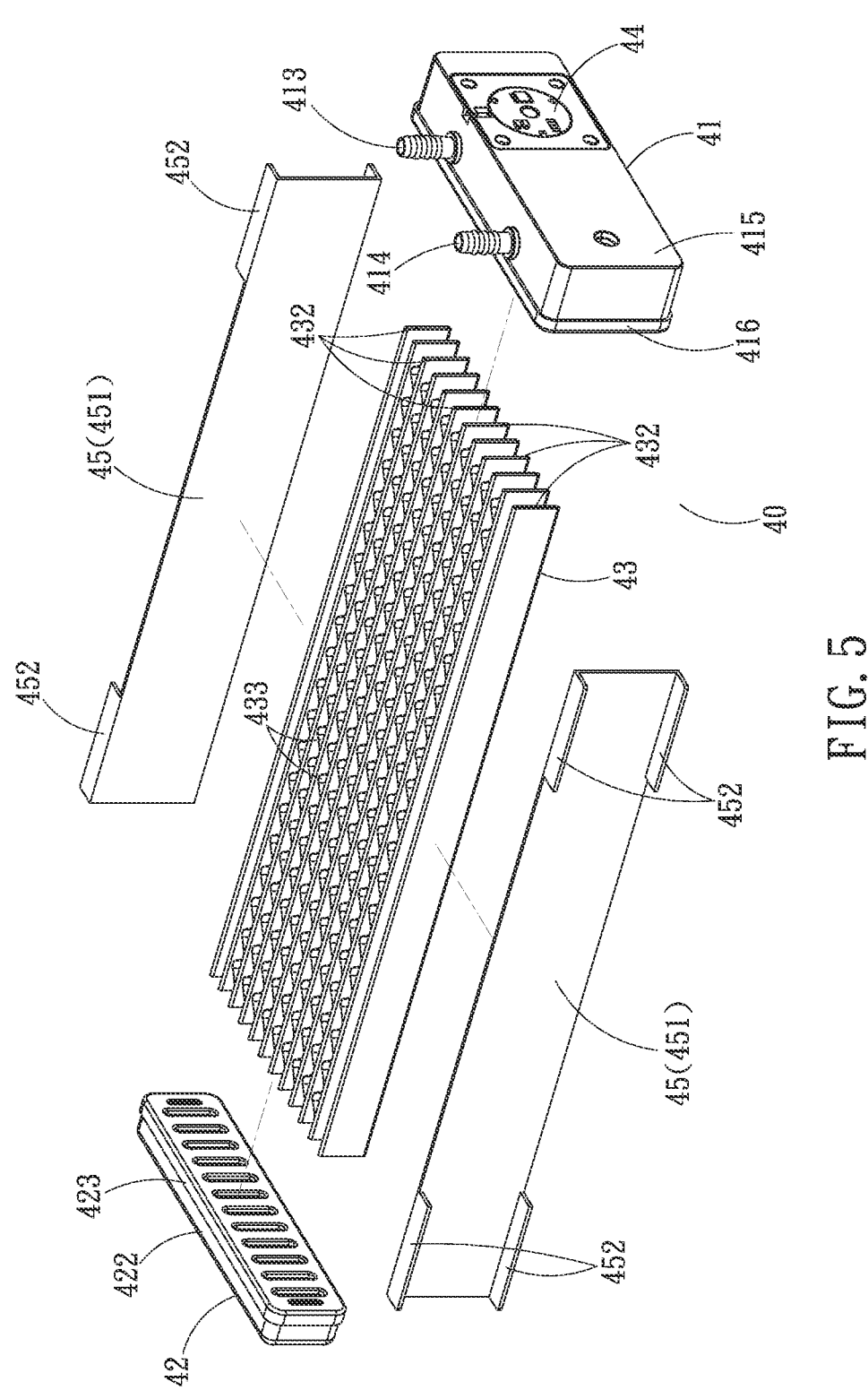
FIG. 5 is an exploded schematic diagram of the liquid cooling radiator in FIG. 2 of the present invention.
Figure 6:
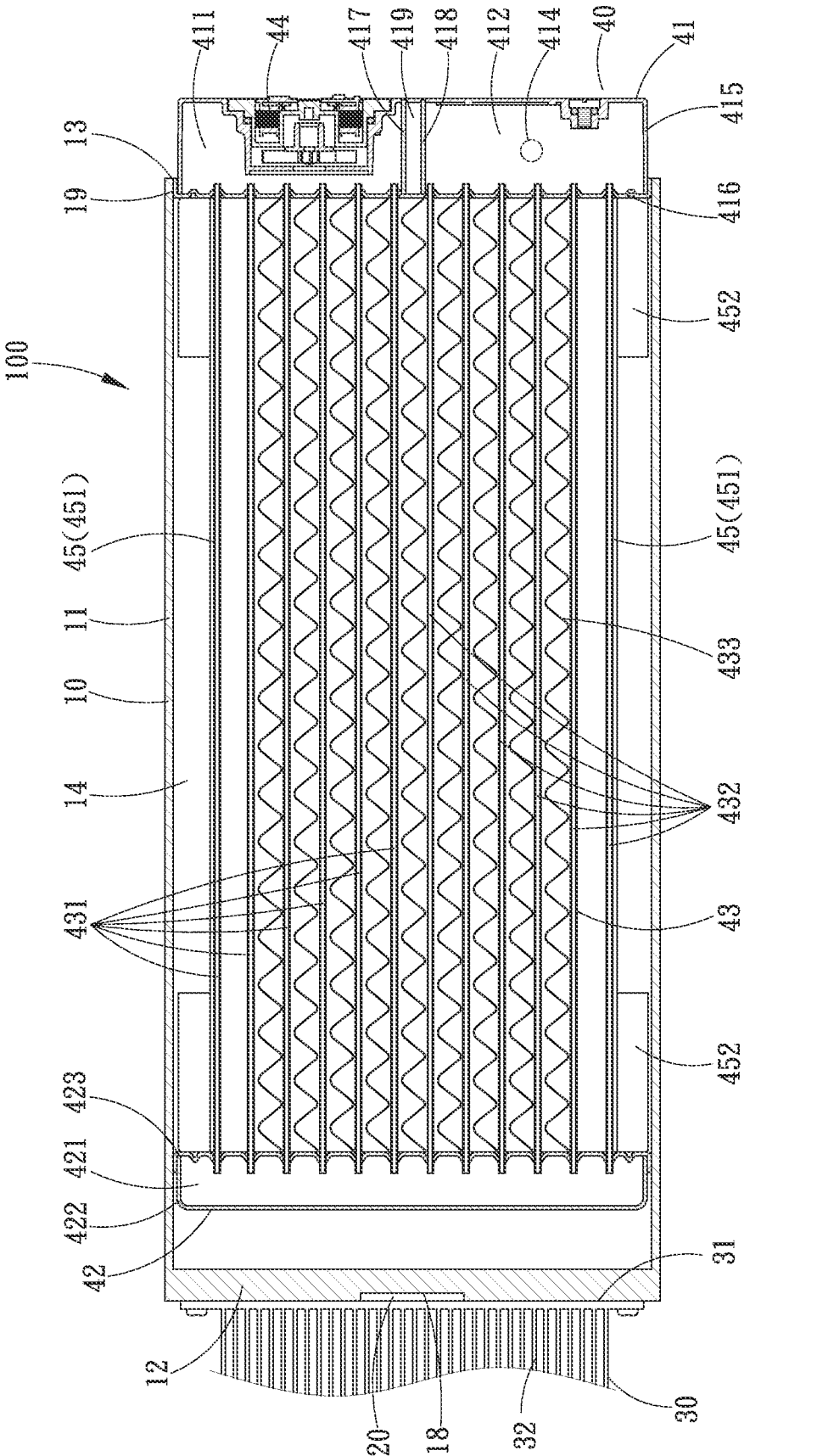
FIG. 6 is a schematic cross-sectional view of the immersed liquid cooling device of FIG. 1 of the present invention.

Referring to FIG. 5 and FIG. 6, the liquid cooling radiator 40 comprises a first liquid box 41, a second liquid box 42 and a heat dissipation radiator pipe set 43 made of aluminum alloy, and a liquid pump 44 for pumping liquid. The first liquid box 41 is internally divided into a hot liquid chamber 411 and a cold liquid chamber 412. The box wall is provided with a hot liquid inlet 413 and a cold liquid outlet 414 respectively connecting the hot liquid chamber 411 and the cold liquid chamber 412. The interior of the second liquid box 42 is a return chamber 421 without partitions. The heat dissipation radiator pipe set 43 comprises a plurality of first radiator pipes 431 and a plurality of second radiator pipes 432. One ends of the first radiator pipes 431 and the second radiator pipes 432 are connected to the hot liquid chamber 411 and the cold liquid chamber 412 of the first liquid box 41 respectively. The other ends of the first radiator pipes 431 and the second radiator pipes 432 are connected to the return chamber 421 of the second liquid box 42. The liquid pump 44 is an existing product and can be directly installed in the hot liquid chamber 411 or cold liquid chamber 412 of the first liquid box 41, making the liquid cooling radiator 40 an integrated liquid cooling radiator with a liquid pump. Thereby, the working fluid is injected into the liquid cooling radiator 40, and the working fluid can be driven to circulate between the liquid cooling radiator 40 and the liquid cooling head 200 through the liquid pump 44. However, the liquid pump 44 may not be provided in the first liquid box 41 of the liquid cooling radiator 40 of the present invention, and the working fluid can be driven to circulate between the liquid cooling head 200 and the liquid cooling radiator 40 by a liquid pump arranged at other locations (such as the above-mentioned liquid pipes 300).

Referring to FIG. 2 and FIG. 6, when assembling the present invention, the second liquid box 42 of the liquid cooling radiator 40 and the heat dissipation radiator pipe set 43 are placed into the liquid storage chamber 14 from the front opening 13 of the liquid storage box 10, and seal (for example, welding seal) the outer peripheral wall of the first liquid box 41 with the front opening 13 of the liquid storage box 10. Then the cooling fluid is introduced into the liquid storage chamber 14 of the liquid storage box 10 from the liquid injection hole 15, so that the second liquid box 42 and the heat dissipation radiator pipe set 43 are completely immersed in the cooling fluid in the liquid storage box 10.

Referring again to FIG. 2 and FIG. 4, the two inner walls of the liquid storage chamber 14 of the liquid storage box 10 of the present invention are preferably provided with two rails 17 respectively, and each of both sides of the heat dissipation radiator pipe set 43 is respectively provided with a positioning frame 45. When the second liquid box 42 of the liquid cooling radiator 40 and the heat dissipation radiator pipe set 43 are loaded into the liquid storage box 10, the positioning frames 45 are limited between the respective two rails 17 in the liquid storage box 10, so that the longer heat dissipation radiator pipe set 43 can be stably installed in the liquid storage box 10 to prevent the heat dissipation radiator pipe set 43 from shaking and causing the welded part of the first liquid box 41 and the front opening 13 to crack or loosen. The positioning frame 45 has a straight plate 451 coupled to a respective one side of the heat dissipation radiator pipe set 43, and a plurality of positioning protruding plates 452 perpendicular to the straight plate 451. During installation, the positioning protruding plates 452 are restricted between respective two rails 17 in the liquid storage box 10. There is a structural design of a fitting portion 19 between the front end surface 171 of each of the above-mentioned rails 17 and the front opening 13 of the liquid storage box 10. During assembly, the first liquid box 41 can be inserted into the front opening 13 until the end surface of the first liquid box 41 abuts the front end surfaces 171 of the rails 17, and then the first liquid box 41 and the front opening 13 are welded together, to achieve the effect that the first liquid box 41 is firmly embedded in the front opening 13 of the liquid storage box 10.

Referring again to FIG. 5 and FIG. 6, the first liquid box 41 of the liquid cooling radiator 40 is composed of a first box body 415 and a first box cover 416, and the second liquid box 42 is composed of a second box body 422 and a second box cover 423. The first box cover 416 and the second box cover 423 are respectively provided with a plurality of pipe sockets respectively in communication with the first box body 415 and the second box body 422. Thereby, the two ends of the first radiator pipes 431 and the second radiator pipes 432 are respectively inserted and welded into the pipe sockets. In order to prevent the hot liquid chamber 411 of the first liquid box 41 from transferring heat to the cold liquid chamber 412, the first box body 415 of the present invention is provided with a hot liquid spacer 417 and a cold liquid spacer 418 in parallel, so that an insulated space 419 is formed between the hot liquid spacer 417 and the cold liquid spacer 418. The insulated space 419 is thereby used to prevent the high-temperature working fluid flowing into the hot liquid chamber 411 from transferring heat to the low-temperature working fluid in the cold liquid chamber 412.

Figure 7:
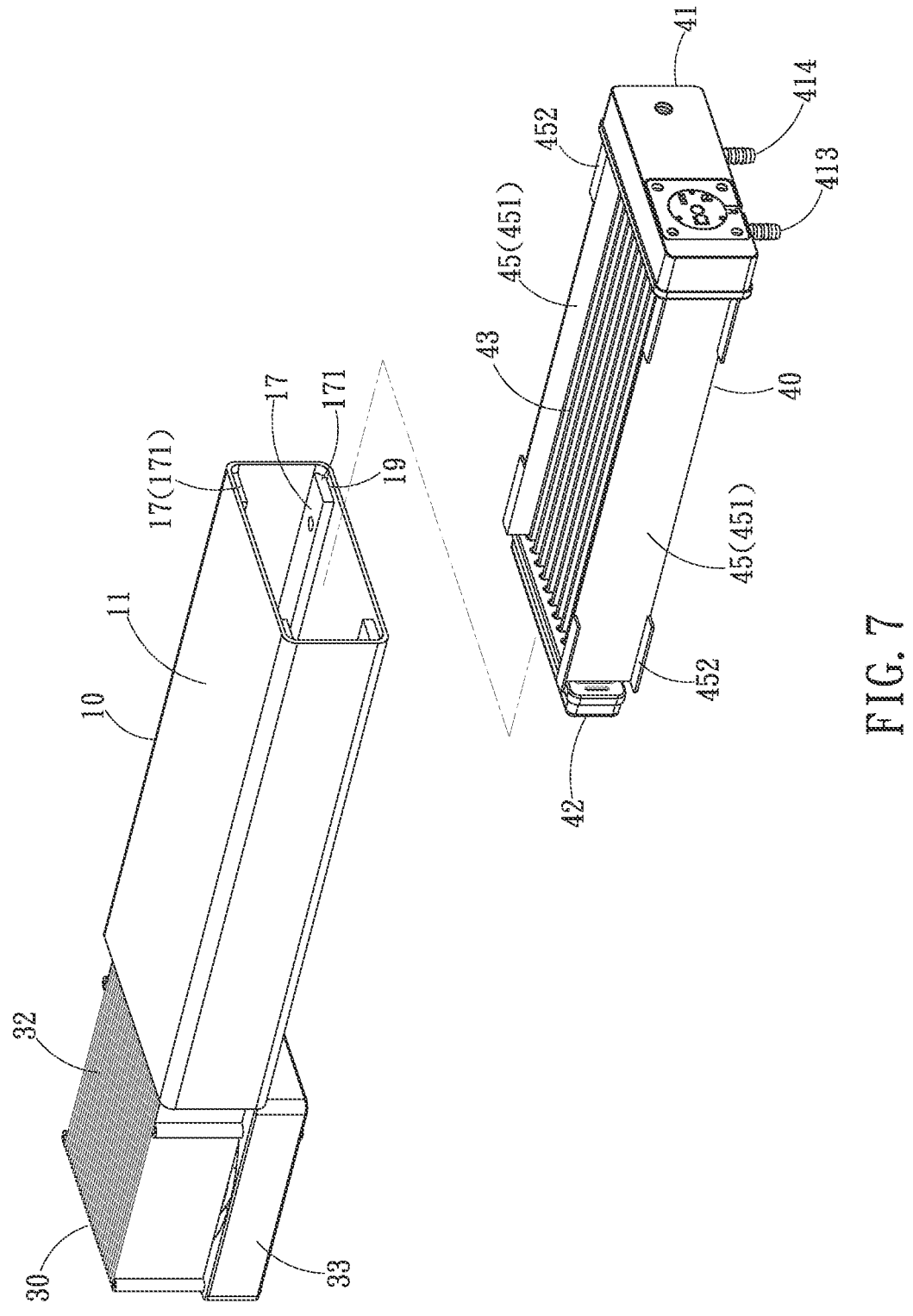
FIG. 7 is a front exploded schematic diagram of the second embodiment of the immersed liquid cooling device of the present invention.
Figure 8:
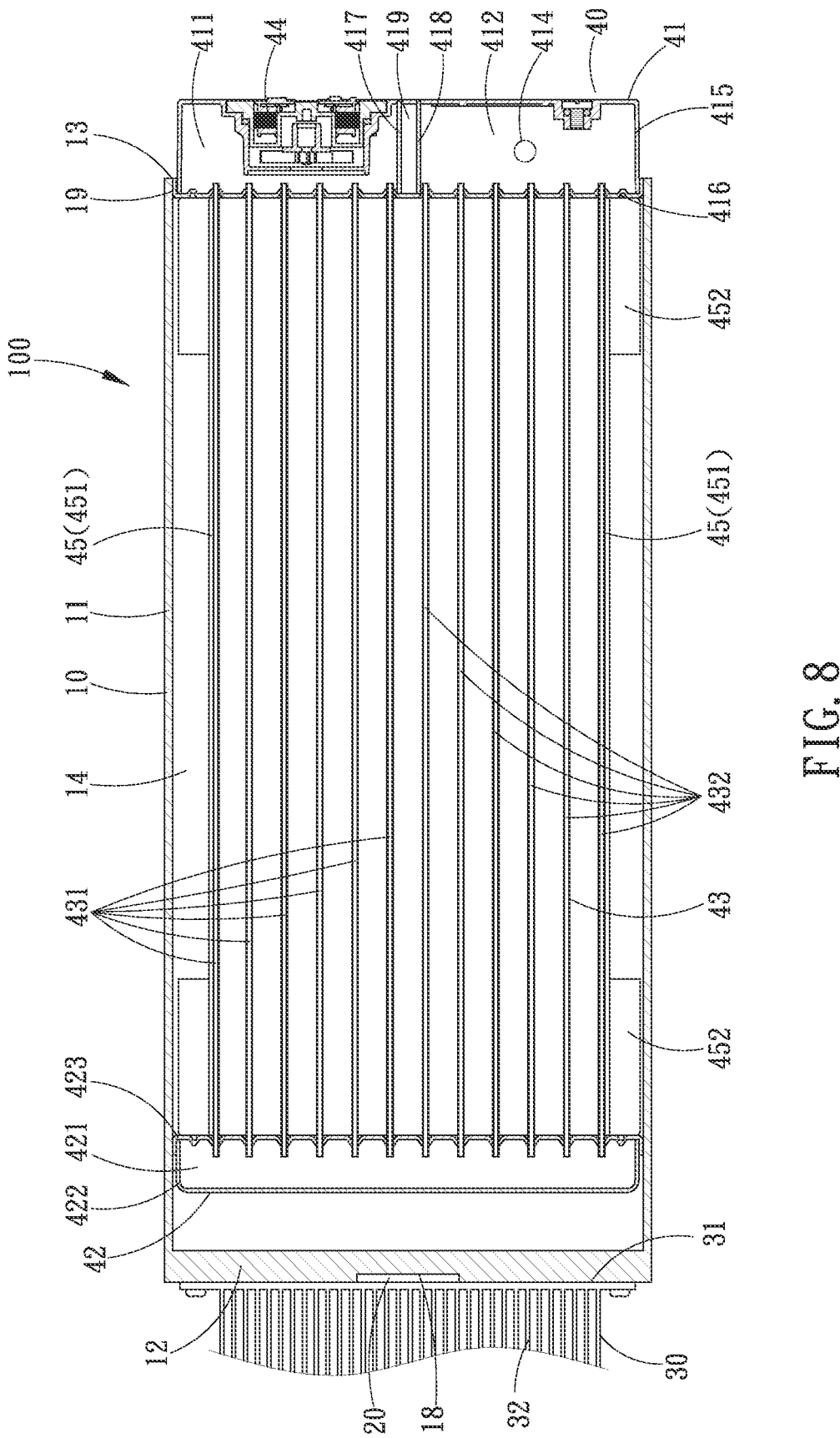
FIG. 8 is a schematic cross-sectional view of the immersed liquid cooling device of FIG. 7 of the present invention.

Referring again to FIG. 5 and FIG. 6, one of the preferred embodiments of the heat dissipation radiator pipe set 43 comprises a wavy radiating fin 433 between each two adjacent pipes of the first radiator pipes 431 and the second radiator pipes 432 to improve its heat dissipation efficiency. Or refer to FIG. 7 and FIG. 8, the heat dissipation radiator pipe set 43 does not need to have the above-mentioned radiating fins 433 between the first radiator pipes 431 and the second radiator pipes 432, and only using the cooling fluid in the liquid storage box 10 is enough to quickly dissipate heat from the working fluid in the first radiator pipes 431 and second radiator pipes 432.

Figure 9:
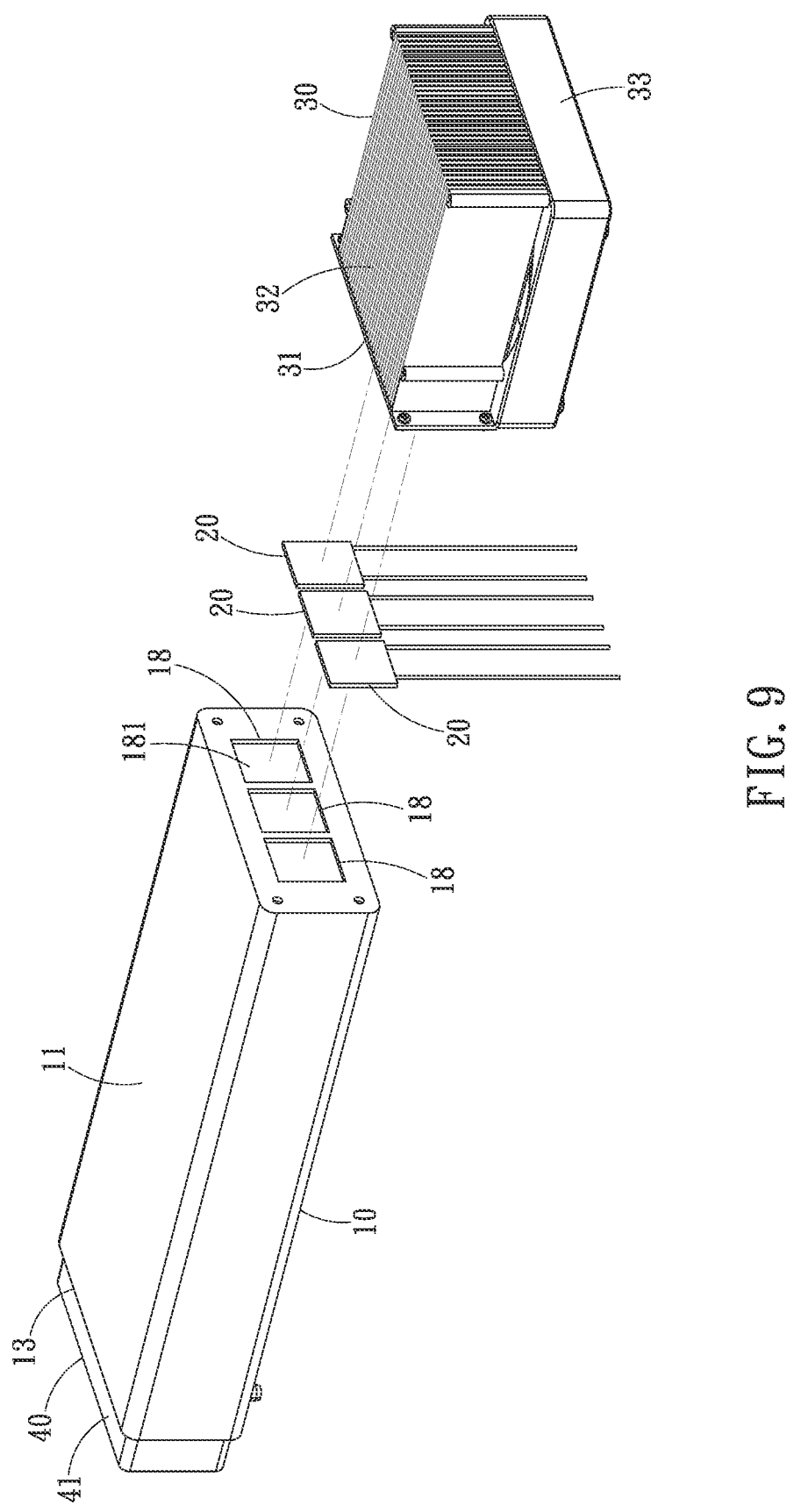
FIG. 9 is an exploded schematic diagram of a plurality of cooling chips installed on the rear wall of the liquid storage box of the present invention.
Figure 10:
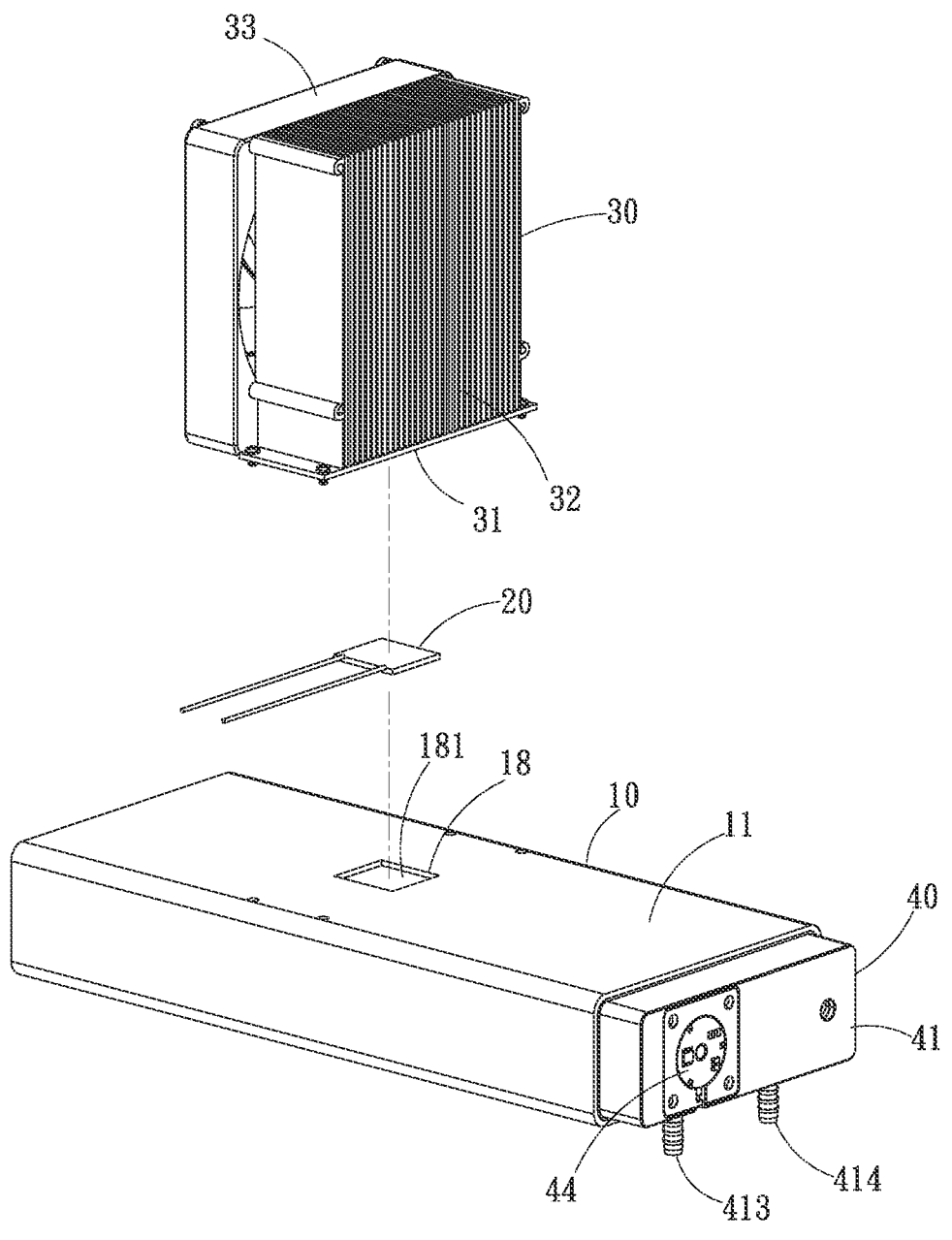
FIG. 10 is an exploded schematic diagram of a cooling chip provided on the peripheral wall of the liquid storage box of the present invention.
Figure 11:
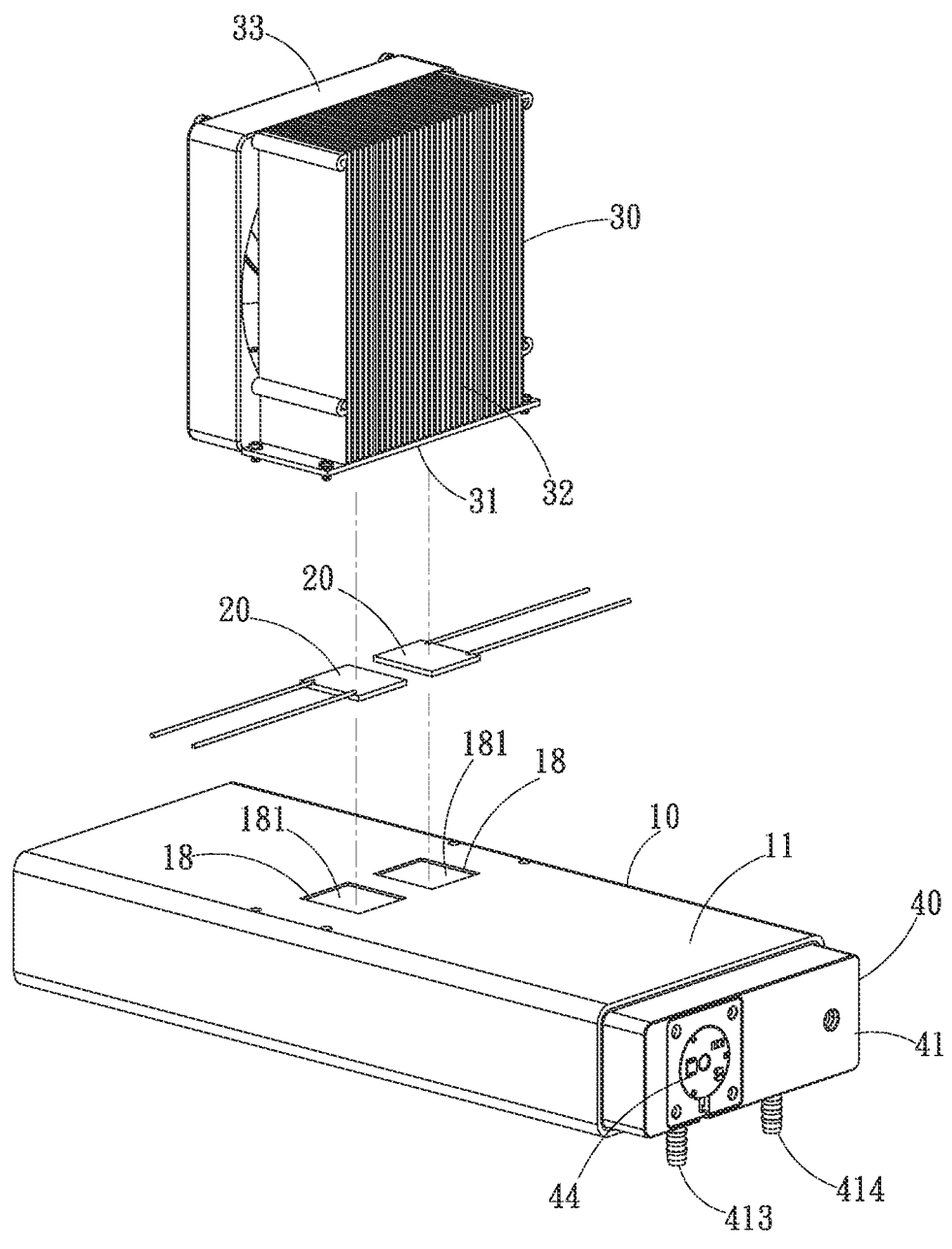
FIG. 11 is an exploded schematic diagram of the liquid storage box peripheral wall of the present invention equipped with multiple cooling chips.

Referring to FIG. 9, in order to improve the cooling efficiency of the cooling fluid, the cooling chip 20 of the present invention can be implemented with more than two, and the rear wall 12 of the liquid storage box 10 is provided with grooves 18 corresponding to the number of cooling chips 20. Furthermore, the cooling chips 20 of the present invention are not limited to being installed outside the rear wall 12 of the liquid storage box 10. As shown in FIG. 10 and FIG. 11, one or more cooling chips 20 can also be installed outside the peripheral wall 11 of the liquid storage box 10. The peripheral wall 11 can also be provided with the same number of grooves 18 for installing cooling chips 20 on the outside.

When the present invention is used, the thermoelectric material of the cooling chip 20 is energized, causing the cold surface 21 of the cooling chip 20 outside the liquid storage box 10 to absorb heat. The cooling fluid in the liquid storage box 10 can be reduced to an ice-cold temperature, and the convection current absorbs heat through the working fluid in the heat dissipation radiator pipe set 43, causing the working fluid to rapidly cool down and then flow to the liquid cooling head 200 to cool down the processor. Since the temperature control of the cooling fluid in the liquid storage box 10 of the present invention depends on the current and voltage energized by the cooling chip 20, it can prevent the ambient temperature from affecting the heat dissipation efficiency of the liquid cooling radiator 40, thereby achieving the effect of improving the heat dissipation efficiency of the liquid cooling device for the processor.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An immersed liquid cooling device, comprising:
a liquid storage box being a metal box with a peripheral wall, a rear wall and a front opening forming a liquid storage chamber, said liquid storage chamber being filled with a cooling fluid;
at least one cooling chip, each said cooling chip having a hot surface and an opposing cold surface and being selectively arranged outside said rear wall or said peripheral wall of said liquid storage box with the cold surface thereof selectively attached to the outside of said rear wall or said peripheral wall of said liquid storage box;
a heat sink with a base thereof attached to the hot surface of each said cooling chip;
a liquid cooling radiator comprising a first liquid box, a second liquid box and a heat dissipation radiator pipe set, said first liquid box being internally divided into a hot liquid chamber and a cold liquid chamber and comprising a box wall provided with a hot liquid inlet and a cold liquid outlet respectively connecting said hot liquid chamber and said cold liquid chamber, said second liquid box comprising a return chamber therein, said heat dissipation radiator pipe set comprising a plurality of first radiator pipes and second radiator pipes, said first radiator pipes and said second radiator pipes having respective one ends thereof respectively connected to said hot liquid chamber and said cold liquid chamber of said first liquid box respective opposite ends thereof connected to said return chamber of said second liquid box; and
wherein said second liquid box of said liquid cooling radiator and said heat dissipation radiator pipe set are placed into said liquid storage chamber from said front opening of said liquid storage box, and then the outer peripheral wall of said first liquid box seals said front opening of said liquid storage box, so that said heat dissipation radiator pipe set is immersed in the cooling fluid in said liquid storage box.

2. The immersed liquid cooling device as claimed in claim 1, wherein said liquid storage chamber of said liquid storage box has two opposite inner walls thereof respectively provided with two rails; said heat dissipation radiator pipe set has two opposite sides thereof respectively provided with a positioning frame, each said positioning frame being limited between the said two rails on the respective said inner wall of said liquid storage chamber of said liquid storage box.

3. The immersed liquid cooling device as claimed in claim 2, wherein each said positioning frame comprises a straight plate fastened to the respective one side of said heat dissipation radiator pipe set, and a plurality of positioning protruding plates perpendicular to said straight plate so that said positioning protruding plates are limited between the respective said two rails.

4. The immersed liquid cooling device as claimed in claim 2, wherein each of said rails has a front end surface, and a fitting portion is provided between the front end surfaces of said rails and said front opening of said liquid storage box; said first liquid box is inserted into said front opening with an end surface thereof abutting the said front end surfaces of said rails.

5. The immersed liquid cooling device as claimed in claim 2, wherein each of said rails has a front end surface, and a fitting portion is provided between the front end surfaces of said rails and said front opening of said liquid storage box; said first liquid box is inserted into said front opening with an end surface thereof abutting the said front end surfaces of said rails.

6. The immersed liquid cooling device as claimed in claim 4, wherein said first liquid box and said front opening of said liquid storage box are welded together.

7. The immersed liquid cooling device as claimed in claim 1, wherein one of said rear wall and said peripheral wall of said liquid storage box is provided with at least one groove, each said groove having a groove base; each said cooling chip is embedded in one respective said groove with the cold surface thereof attached to said groove base of the respective said groove.

8. The immersed liquid cooling device as claimed in claim 6, wherein the number of said at least one cooling chip is multiple, and the number of said at least one groove located on one of said rear wall and said peripheral wall of said liquid storage box corresponds to the number of said cooling chips.

9. The immersed liquid cooling device as claimed in claim 1, wherein said first liquid box comprises a first box body and a first box cover, and said second liquid box comprises a second box body and a second box cover, said first box cover and said second box cover being respectively provided with a plurality of pipe sockets respectively communicating with said first box body and said second box body; said first radiator pipes and said second radiator pipes have respective two ends thereof respectively inserted and welded to said pipe sockets.

10. The immersed liquid cooling device as claimed in claim 8, wherein said first box body is internally provided with a hot liquid spacer and a cold liquid spacer arranged in parallel with an insulated space formed between said hot liquid spacer and said cold liquid spacer, the hot liquid spacer is separated from the cold liquid spacer, and wherein said hot liquid spacer and sid cold liquid spacer are separate from said hot liquid chamber and said cold liquid chamber.

11. The immersed liquid cooling device as claimed in claim 1, wherein said heat dissipation radiator pipe set further comprises a plurality of radiating fins respective set between each two adjacent said first radiator pipes and said second radiator pipes.

12. The immersed liquid cooling device as claimed in claim 1, wherein said heat sink comprises a fan disposed on one side thereof and used to drive cold air flow through said heat sink for heat dissipation.

13. The immersed liquid cooling device as claimed in claim 1, wherein said liquid cooling radiator comprises a liquid pump arranged in one of said hot liquid chamber and cold liquid chamber of said first liquid box.

\* \* \* \* \*